(12) United States Patent
Carley

(10) Patent No.: US 7,492,019 B2
(45) Date of Patent: Feb. 17, 2009

(54) MICROMACHINED ASSEMBLY WITH A MULTI-LAYER CAP DEFINING A CAVITY

(75) Inventor: L. Richard Carley, Sewickley, PA (US)

(73) Assignee: IC Mechanics, Inc., Pittsburgh, PA (US)

( * ) Notice: Subject to any disclaimer, the term of this patent is extended or adjusted under 35 U.S.C. 154(b) by 168 days.

(21) Appl. No.: 10/383,814

(22) Filed: Mar. 7, 2003

(65) Prior Publication Data
US 2004/0173886 A1   Sep. 9, 2004

(51) Int. Cl.
*H01L 31/058* (2006.01)
(52) U.S. Cl. .............................. 257/415; 257/E31.117; 257/E31.119; 257/E23.118
(58) Field of Classification Search ................ 257/415; 438/51
See application file for complete search history.

(56) References Cited

U.S. PATENT DOCUMENTS

| | | | | |
|---|---|---|---|---|
| 5,285,131 A | * | 2/1994 | Muller et al. | 313/578 |
| 5,493,177 A | * | 2/1996 | Muller et al. | 313/578 |
| 5,683,591 A | * | 11/1997 | Offenberg | 216/2 |
| 6,023,091 A | * | 2/2000 | Koch et al. | 257/536 |
| 6,118,164 A | * | 9/2000 | Seefeldt et al. | 257/417 |
| 6,555,904 B1 | * | 4/2003 | Karpman | 257/704 |
| 6,936,494 B2 | * | 8/2005 | Cheung | 438/55 |
| 2004/0155320 A1 | * | 8/2004 | DeJule et al. | 257/659 |

* cited by examiner

*Primary Examiner*—David A Zarneke
(74) *Attorney, Agent, or Firm*—Foley & Lardner LLP; Joseph M. Maraia; Christopher Everett

(57) ABSTRACT

This invention comprises a process for fabricating a micro mechanical structure in a sealed cavity having a multi-layer high stiffness cap. The high stiffness material used for the cap protects the underlying microstructure from destructive environmental forces inherent in the packaging process and from environmental damage.

9 Claims, 15 Drawing Sheets

MICROMACHINED ASSEMBLY WITH A MULTI-LAYER CAP DEFINING A CAVITY

CROSS-REFERENCE TO RELATED APPLICATIONS

This application claims the benefit of priority under 35 U.S.C. §120 from co-pending, commonly owned U.S. non-provisional patent application, Ser. No. 10/374,150, entitled "MICROMACHINED ASSEMBLY WITH A MULTI-LAYER CAP DEFINING A CAVITY," filed on Feb. 25, 2003.

FIELD OF THE INVENTION

This invention relates to the field of integrated circuits that incorporate micro-electro-mechanical systems (MEMS) or other micro-mechanical devices, and, in particular, to the creation of sealed cavities for the encapsulation of said MEMS or micro-mechanical devices.

BACKGROUND OF THE INVENTION

It is known in the prior art to create sealed cavities on an integrated circuit wafer for a variety of applications, for example, as a pressure sensor or a microphone. It is also known to encapsulate movable micro-mechanical components on a wafer within a sealed cavity. The encapsulation of micro-mechanical structures in a sealed cavity is desirable for several reasons. First, a seal that substantially prevents water vapor, dust, and atmospheric gases from entering the space adjacent to the mechanical structure greatly improves the tolerance of the micro-mechanical structures to ambient conditions, such as high humidity. Second, the dicing and packaging of the wafers bearing micro-mechanical structures is greatly facilitated because standard water-based saw slurries can be used without concern that the slurry will contaminate the micro-mechanical structures. Third, when the sealed cavity is at a low or very low pressure, the Brownian noise due to the motion of gas molecules can be significantly reduced.

Processes for the creation of sealed cavities containing MEMS devices using thin-film depositions are well known in the prior art. For purposes of this application, the term "thin film deposition" refers to any deposition scheme in which the atoms are assembled from a gaseous or plasma phase onto the surface of the wafer bearing the micro-mechanical device(s). See, for example, U.S. Pat. Nos. 5,285,131 and 5,493,177 (both to Muller, et al.) in which methods to create an incandescent lamp and a vacuum tube respectively are disclosed. The use of thin-film deposition techniques is desirable, because of the accuracy with which the thin films can be patterned, the high quality of the adhesion of the thin films to the wafer surface, and the low cost involved in thin film deposition techniques, compared to wafer-wafer bonding approaches.

A typical thin-film deposition process is as follows. A silicon substrate is covered with a protective layer that is selectively removed, thereby exposing the silicon wafer in the region to be encapsulated. Then, a layer of sacrificial material is deposited to support the structural layer as it is formed. The structural layer is deposited and patterned on the sacrificial layer, and is then covered by a second sacrificial layer. The second sacrificial layer supports a cap layer during its formation. To remove the sacrificial layers, thereby releasing a MEMS or other micro-mechanical device, holes are etched through the cap layer down to the sacrificial layers and an etching agent is introduced to remove the sacrificial layers. Once the MEMS device has been released, the holes in the cap layer are sealed by another thin-film deposition process. Complex structures may require additional layers of structural or sacrificial materials.

Typically, the cap layer is composed of a thin layer of silicon nitride. However, although silicon nitride is a very hard material, it is difficult to deposit silicon nitride in thick layers with good control of stresses. Alternatively, caps have been made of metal, such as aluminum. In this case the cap thickness can be made greater; however, the material itself is ductile and can be deformed by pressure. Therefore, one problem with the capping technology that is available today is that the caps are relatively weak. Differences in pressure created when the sealed cavity encloses a vacuum can cause the cap to collapse inward. Additionally, stresses placed on the cap during packaging can cause the cap to collapse or to bow inward. For example, enclosing the wafer in plastic packaging exposes the cap to hot, high pressure plastic, often at temperatures up to about 300 degrees C., and pressures up to about 3000 psi, during the injection molding process. Such conditions can often damage these caps, resulting in the destruction of the fragile encapsulated microstructure. Caps constructed using the thin-film deposition technologies available today are not able to withstand such pressures.

To avoid damage during the packaging process, it is known in the prior art to cover micro-mechanical structures on a wafer with a second wafer made of silicon or glass, which has an etched cavity over the micro-mechanical structure, and which is in some way bonded to the original wafer bearing the micro-mechanical structures. Several methods are well known in the art for creating a bond between the wafer containing the micro-mechanical structures and the wafer that implements the cap. In particular, anodic bonding can be used. In addition, by depositing and patterning a eutectic metal alloy in the region where a seal is to be formed, the two wafers can be bonded in a process that is much like soldering. However, all of these two-wafer methods, in addition to adding significant expense to the processing thereof, reduce the available device area on the surface of the wafer due to space needed to support the capping wafer seal to the micro-mechanical wafer, thereby resulting in fewer devices per wafer and increasing the cost per device.

Therefore, it would be desirable to introduce a way to strengthen a thin-film cap to encapsulate a micro-mechanical device such that it is not susceptible to damage caused by the difference in pressure between the sealed cavity and the ambient or by the harsh environment that it may be exposed to during the plastic injection molding process, and which also conserves wafer real estate.

SUMMARY OF THE INVENTION

This invention is an improvement on prior art methods of scaling encapsulated MEMS devices. The improvement involves forming a thin-film cap from a layer of a material characterized by a relatively high strength and stiffness, such as, for example, aluminum oxide or alumina ($Al_2O_3$), which is many times stiffer than materials used in prior art aluminum caps. The overall stiffness of a cap is a function of both material's hardness and the cap's thickness. While silicon nitride may be as strong, on a per unit basis, as alumina, it is not known how to deposit thick low stress silicon nitride layers. Also, it is known in the prior art to apply alumina to the heads of magnetic disk drives, however, there are no known uses of alumina in the manufacture of MEMS devices.

It is known in the prior art that silicon nitride may be used to provide a hermetic seal over a cavity. However, it is not known to deposit a strong, stress-free layer of silicon nitride which is thick and rigid enough to sustain the pressures, temperatures and stresses of plastic packaging. Prior art attempts to create thick layers of silicon nitride have resulted in caps having a very high intrinsic stress gradient, which may cause the cap to pull away from the wafer, destroying the hermiticity of the cavity.

The present invention features a micromachined assembly that includes a substrate and a cap structure that defines a closed capsule about an interior region. A microstructure may or may not be disposed within the capsule defined by the substrate and cap. In particular, in a micromachined assembly constructed in accordance with one embodiment of the invention, the substrate has a support surface upon which a microstructure may be disposed. A cap layer extends from points on the support surface disposed about the microstructure. The cap layer includes a portion overlying the microstructure. A cap overlayer extends from the support surface and is disposed over, and contiguous with, the cap layer. The cap layer, the cap overlayer and the support surface define a closed capsule or sealed cavity about an interior region, which may contain a microstructure. In a preferred embodiment, the cap structure is characterized by a high stiffness, relative to known prior art materials such as silicon nitride and aluminum.

Either the cap overlayer or the cap layer, or both, are made of one or more materials characterized by a high stiffness and which are also able to be deposited in relatively thick layers In a preferred embodiment, the material(s) forming the cap overlayer is characterized by a relatively high stiffness, with respect to the material(s) forming the cap layer. In an alternate embodiment, the material(s) forming the cap layer may be characterized by a relatively high stiffness with respect to the material(s) forming the cap overlayer.

Examples of typical microstructures which may require encapsulation include, but are not limited to, a micro-electromechanical system (MEMS), a surface acoustic wave (SAW) device, a film bulk acoustic resonator, an integrated circuit (IC), or a capacitive sense plate adapted to measure ambient pressure due to a variation in the spacing between the substrate and the inner surface of the cap layer.

In one embodiment of the invention, the cap layer includes a top portion distalmost from the support surface. The top portion extends in a direction substantially parallel to the support surface. The cap layer also includes a lateral portion extending between the top portion and the support surface. The cap layer may include one or more ports or openings extending therethrough for purposes of introducing an etching agent into the cavity to remove any sacrificial material used in the construction of the cap layer and/or any microstructures contained in the cavity. In one embodiment, the ports may be disposed in the lateral portion of the cap layer in a direction substantially transverse to a normal to the support surface. Alternatively, the ports may be disposed in the top portion of the cap layer. In yet another embodiment, the substrate may include one or more ports extending therethrough in a direction substantially transverse to a normal to the support surface. The interior region within the closed capsule may be substantially filled with a noble gas. The application of the cap overlayer serves to seal the ports.

In a preferred embodiment, the cap overlayer is a multi-layer structure, and has an innermost layer contiguous with the cap layer. The cap overlayer may be formed of a relatively high energy sputtered material. At least the lowermost layer within the multilayer structure is a relatively high energy RF sputtered material. For example, the lowermost layer may be a thin film deposited using RF plasma sputtering. At least two adjacent layers of the cap overlayer may be layers of a high stiffness material (such as alumina), and at least one of the adjacent layers is preferably an RF-sputtered layer. The cap overlayer may be a graded density structure. The cap overlayer preferably (but not necessarily) has a region that is contiguous with the cap layer, and that is characterized by a relatively high density compared to the density of the cap layer.

The invention in one form is directed to devices made by a process which includes the deposition of one or more layers of a material or materials which have a low intrinsic stress or which are stress-free, and which are rigid enough to withstand the rigors of plastic packaging. Alumina is a preferred material. Additionally, other ionic or covalently bonded materials may also be used (in place of alumina) that have high stiffness relative to prior art materials, and that can withstand the rigors of plastic packaging. Thus, the cap materials which can be chosen for such applications include ionic bonded, covalently bonded, or mixed ionic and covalent bonded materials.

In one exemplary embodiment of the invention, a cap layer made of a high-stiffness material, namely alumina, may be deposited by a traditional sputtering process, or by other deposition processes, as a multi-layer structure. During the deposition of the alumina cap layer(s), it is important to avoid or at least minimize the formation of voids in the cap structure at places where sharp edges exist in the underlying inner cap layer or microstructure layers or sacrificial layers. Voids within a cap overlayer may concentrate stress and possibly lead to the eventual failure of the seal. In addition, in cases where the device is to be dispersed in a molded plastic package (formed by injecting hot plastic from the side of the micromachined cap structure), it is desirable to have the edges of the cap structure be smooth and conformal to decrease the forces on the cap structure during plastic injection molding. To minimize the formation of voids and to make the surface of the cap structure more conformal, the cap structure is preferably deposited in several layers under varying deposition conditions. In certain exemplary embodiments of the invention, the various layers of the cap structure may be applied using sputtering deposition techniques with varying bias voltages between the source and deposition substrate, and under varying deposition ambient pressures, to control the microstructure properties of one or more of the layers that make up the overall cap overlayer or the cap layer. Such a multi-layer deposition process provides a reduction of stress within the deposited material forming the cap structure, resulting in a very low intrinsic stress gradient in the cap structure, providing resistance to buckling under high ambient pressure.

In addition, the deposition properties of the layers immediately in contact with the underlying wafer must be selected to provide good and uniform adhesion of the cap layer to the underlying wafer near the perimeter of the cavity, where the cap meets the wafer surface. In the present application "good adhesion" is defined to mean an adhesion that is firm enough to effect a barrier to gases, and to prevent the cap structure from separating from the wafer due to intrinsic stress or when subjected to environmental stresses. In the example of a sputtering deposition system, the wafer surface is preferably sputter cleaned before the deposition begins to further improve the adhesion of the cap layer to the underlying surface.

DETAILED DESCRIPTION

Disclosed herein are methods of creating high stiffness, high strength caps for the creation of cavities enclosing regions of interest on wafer surfaces and techniques to prevent formation of voids in the caps, where the caps are comprised of one or more high-stiffness materials, such as, for example, alumina, and are preferably deposited using a process designed to increase the rigidity and stiffness of the cap as well as its adhesion to the wafer surface.

In the present application, the term "high stiffness material" is henceforth defined to mean a material that is characterized by having a Young's modulus in excess of 80 GPa and which can be deposited in layers between 5 and 50 microns in thickness. Cap structures composed of or overlaid by one or more layers of a high stiffness material is preferably stiff enough to withstand a uniform pressure equivalent to up to about 60 atmospheres, with no portion of the cap structure deflecting by more than 1 micron from its initial position. Existing thin-film capping methods in the prior art cannot achieve such stiffness because the thin film layers as taught in the prior art cannot be deposited thick enough in the size ranges of interest for capping typical microstructures.

In the following description of exemplary embodiments, an exemplary MEMS microstructure that can be utilized as a Z-axis accelerometer will be used to facilitate the description. The exemplary MEMS device consists of a paddle shaped MEMS microstructure anchored at one point by a thin supporting member such that it can move in the Z direction within the sealed cavity. This structure is meant to be an exemplar only to illustrate the methods disclosed herein, and is not meant to limit the scope of the present disclosure. One skilled in the art will appreciate that the exemplary methods and the exemplary caps disclosed herein may be used in connection with other MEMS microstructures or other devices, or with cavities which are void of internal microstructures, and the invention is not meant to be limited thereby.

Figure 1A:
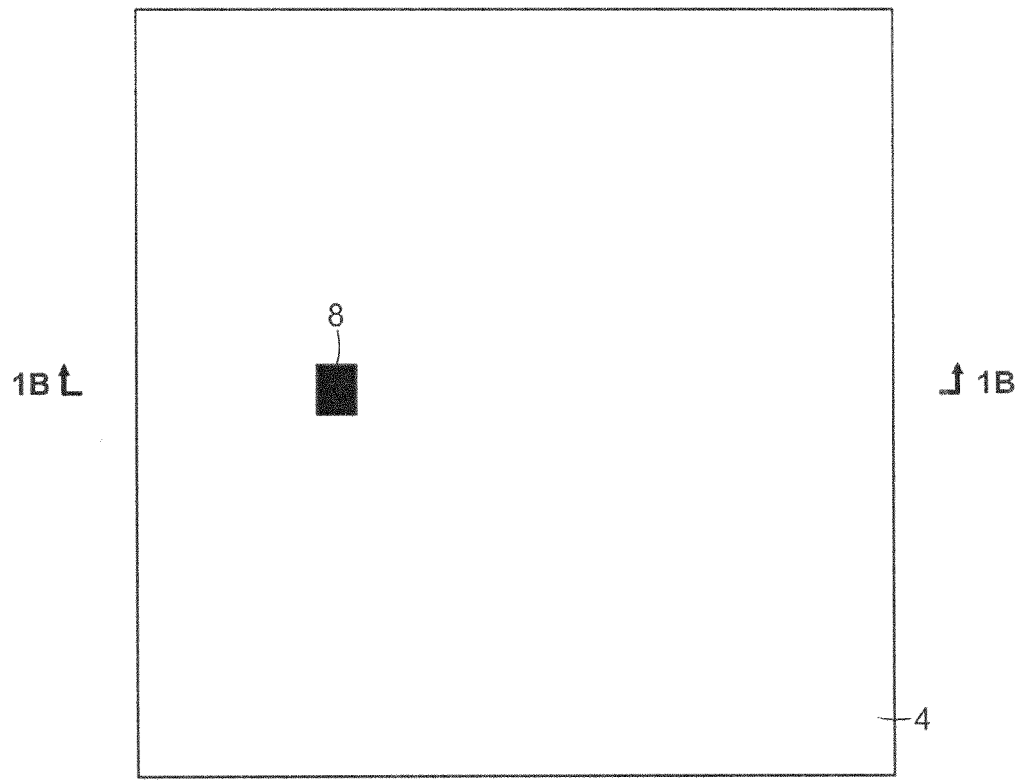
FIGS. 1A and 1B show a top view and a side cross-sectional view respectively of the silicon CMOS wafer used as the base of the MEMS micro-encapsulated structure.
Figure 1B:
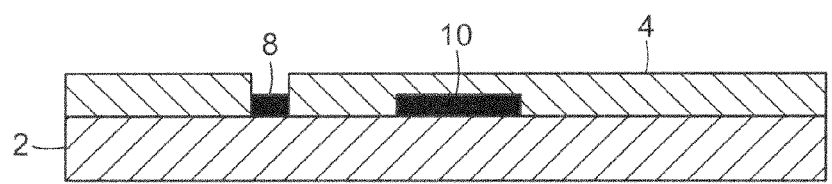

The figures illustrate an exemplary sequence of steps for fabricating an encapsulated microstructure. Initially, a substrate such as, for example, a silicon CMOS wafer 2 coated with a layer of silicon nitride 4 and having metal pads 8 and 10 interfacing to the original CMOS integrated circuit is obtained, as shown in FIGS. 1A and 1B. The substrate has a support surface which defines a portion of the wall of the cavity. In one embodiment, the substrate may be a CMOS structure, with the support surface being a passivation layer, and may include CMOS circuitry defined within the substrate. In this exemplar, a void is disposed in silicon nitride layer 4 to allow access to metal pad 8. In the illustrated exemplary embodiment, the metal pads are aluminum, but may alternatively be copper or any other conductive material. Note that it is not necessary that a silicon wafer with CMOS or any other form of electronics be used for this process, or that the wafer itself be silicon. One skilled in the art will appreciate that the invention is applicable to wafers composed of any material, such as, for example, gallium arsenide.

Figure 2A:
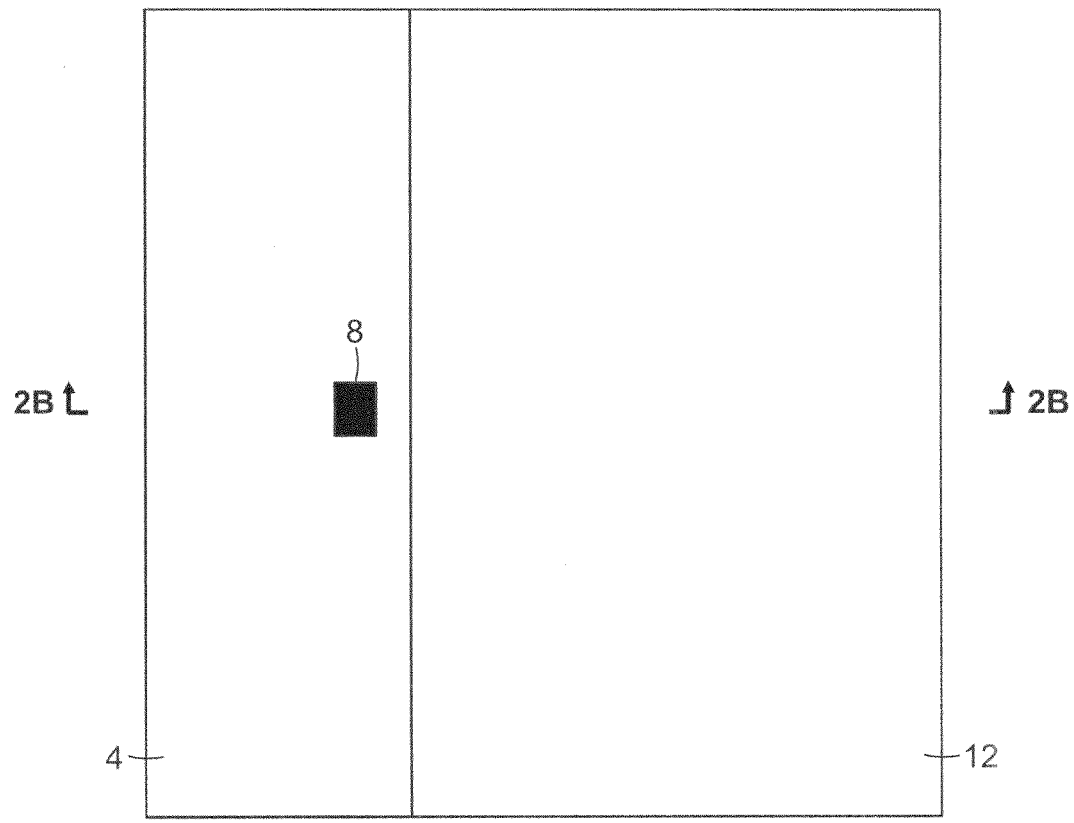
FIGS. 2A and 2B show a top view and cross-sectional views respectively of the wafer with a sacrificial layer deposited thereon.
Figure 2B:
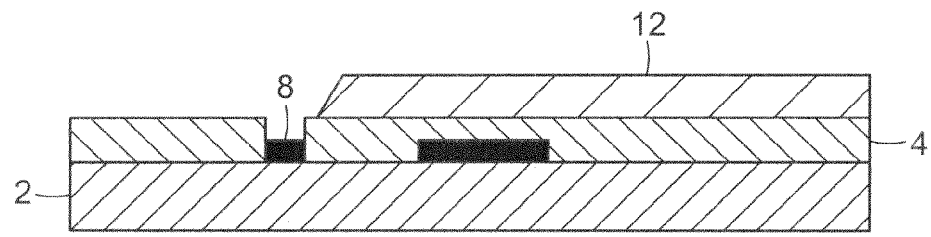

To begin the fabrication process, as shown in FIGS. 2A, 2B and 2C, a layer of sacrificial material 12 is deposited on top of the passivation layer of the standard CMOS wafer 2, which in this case is silicon nitride layer 4.

In certain exemplary embodiments, all or some of the MEMS device fabrication steps may be performed at low temperature on top of the complete CMOS wafer 2, thereby leaving the circuitry therein unaffected. Access vias in passivation layer 4 may be left during the CMOS IC design and sacrificial layer 12 is removed over these vias if access to the metal contacts is desired. The exposed metal contacts, such as metal contact 8 are then used to make connections between the MEMS microstructure and the CMOS circuitry in CMOS wafer 2 below.

Microstructure 14 may be composed of any metal, for example, Al, W, Ti, Ta, Cu, Ni, Au, Mo, etc. The selection of material for a particular microstructure layer is dictated by a number of factors including, for example, how much residual stress gradient in the material is acceptable for a particular application, the mass requirement of the structure to meet specific application needs, and the availability of a selective etchant that removes sacrificial material, but which has a low etch rate with respect to silicon nitride passivation layer 4 and microstructure 14.

Figure 3A:
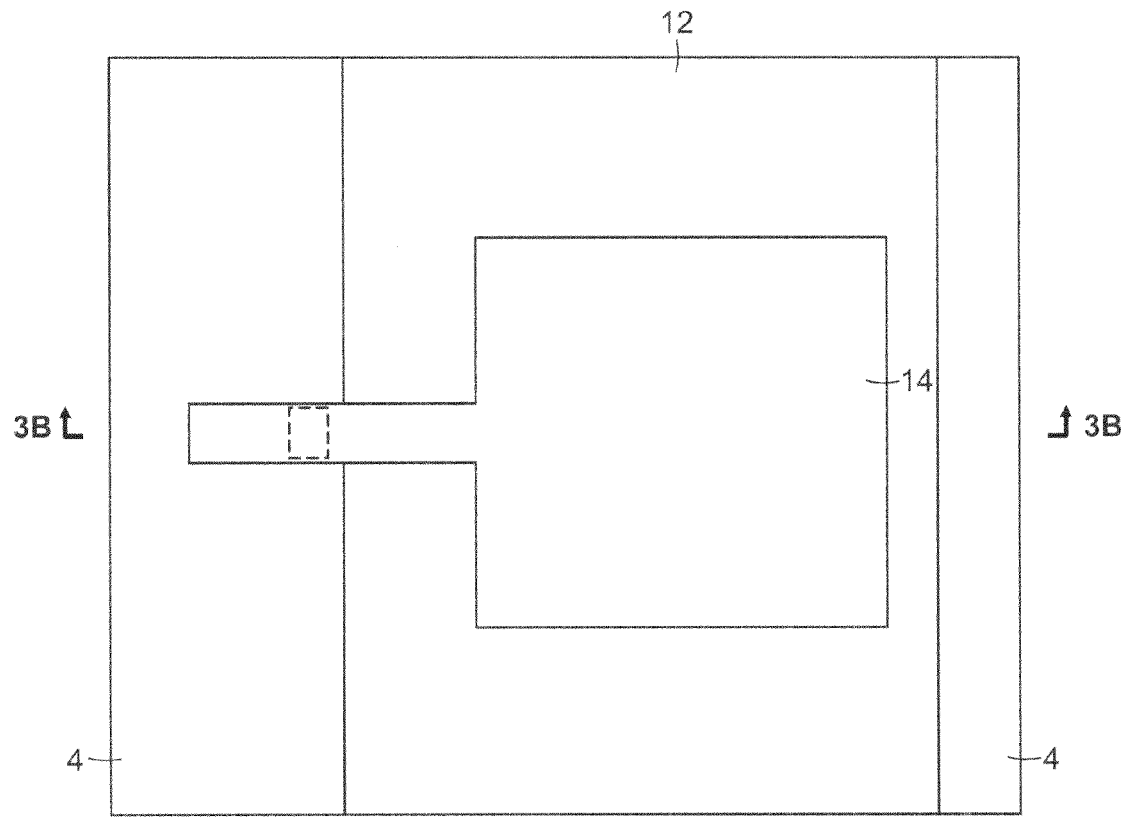
FIGS. 3A and 3B show a top view and a cross-sectional view respectively of the wafer having a structural layer added thereon.
Figure 3B:
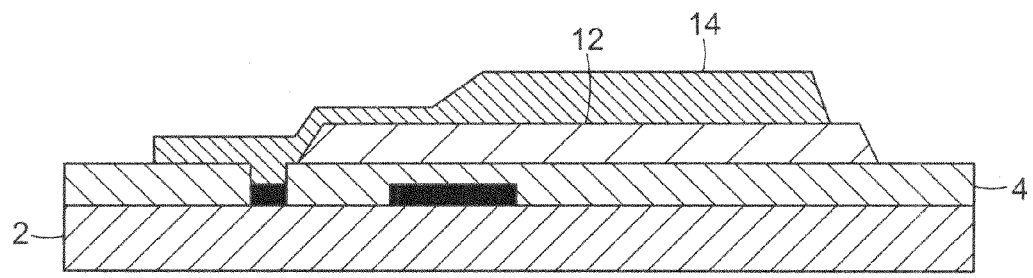

The deposition of the MEMS structural layer is shown in FIGS. 3A and 3B. MEMS microstructure 14 is deposited by prior art methods known to those with ordinary skill in the art, and the undesirable portions are etched away, thereby leaving the desired shape of microstructure 14 behind. Both subtractive and additive methods may be used to create the desired pattern in the microstructure. The top view in FIG. 3A clearly shows the shape of the exemplary microstructure as being a paddle having a long thin beam attached to an anchor point, which in this case is metal contact 8.

Figure 4A:
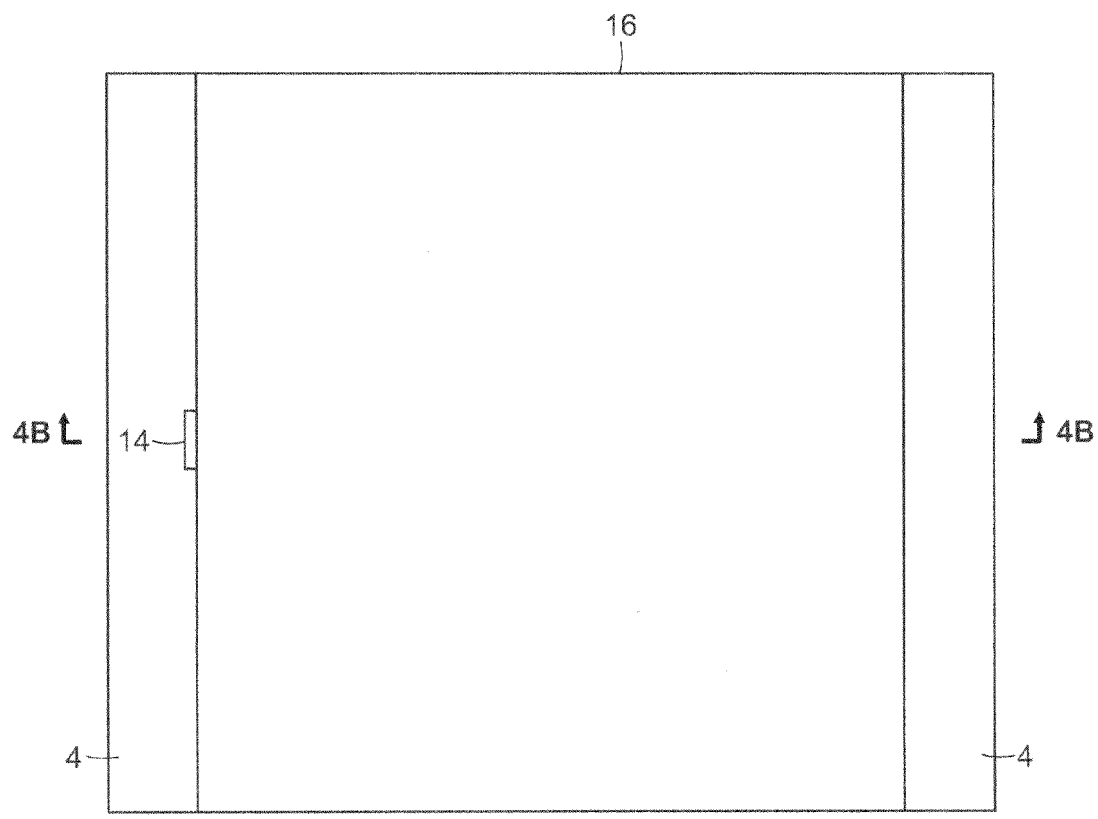
FIGS. 4A and 4B show a top view and a cross-sectional view respectively of the wafer having a second sacrificial layer deposited thereon.
Figure 4B:
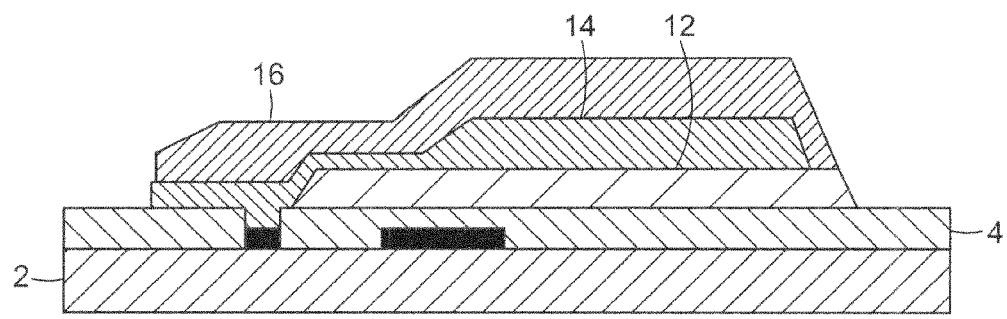

Next, as shown in FIGS. 4A and 4B, a second sacrificial layer 16 may be deposited over microstructure 14. It can be seen from the top view that portions of the second sacrificial layer 16 will come into contact with portions of the bottom sacrificial layer 12, in particular, those areas near the edges of the paddle-shaped main body of the microstructure and those areas on either side of the thin connecting beam portion 15 of the microstructure.

It is preferable that sacrificial layers 12 and 16 be of the same material and in communication with each other, such that when an etchant is introduced, both layers will be etched away without the need to etch additional etchant entry holes. Alternatively, sacrificial layers 12 and 16 may be of different materials, as dictated by the shape and complexity of microstructure 14. Although not necessary in the construction of the exemplary microstructure, more complex microstructures, or multiple microstructures in the same cavity may require etching away of various sacrificial layers at different times, making it necessary to use different materials for the sacrificial layers and different etchants.

One preferred material for sacrificial layers 12 and 16 is photoresist. Photoresist may be chosen because it can be easily etched with an oxygen plasma gas, which is not destructive of microstructure 14, silicon nitride passivation layer 4 or cap layer 18. If sacrificial layers 12 and 16 are of different materials it is possible to etch them separately by selecting an etchant that is selective to one and not the other.

A cap layer 18 is then deposited over the sacrificial layers 12 and 16. The cap layer 18 extends from points on the support surface of the surface disposed about the microstructure, and includes a portion overlying the microstructure 14. Cap layer 18 may optionally be applied using standard techniques known in the art, prior to the application of one or more cap overlayers composed of a high stiffness material. Cap layer 18, may, for example, be necessary for the operation of microstructure 14, as in the case when cap layer 18 is composed of a metal.

Figure 5A:
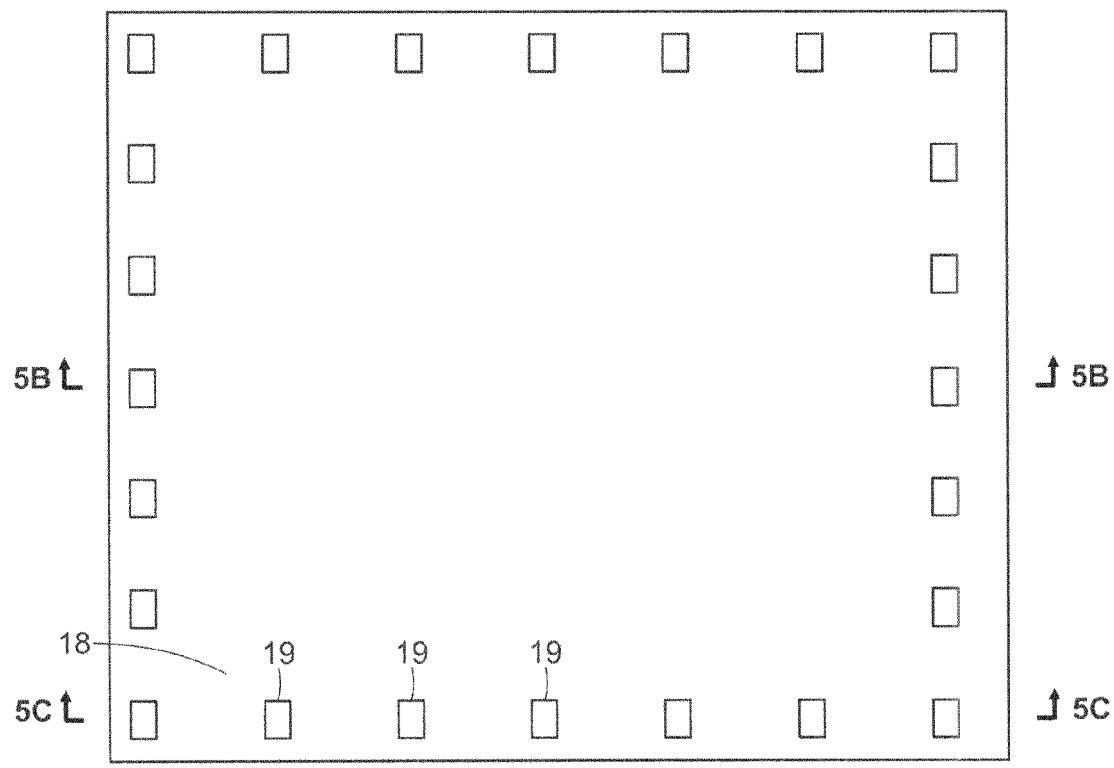
FIGS. 5A, 5B and 5C show a top view and a cross-sectional view respectively of the wafer having an inner cap layer applied thereto.
Figure 5B:
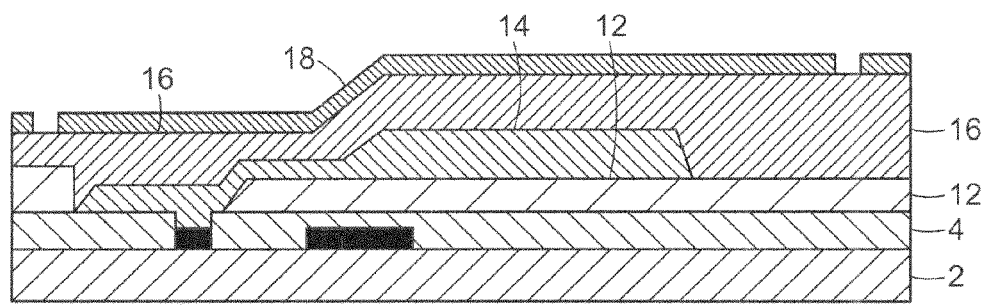
Figure 5C:
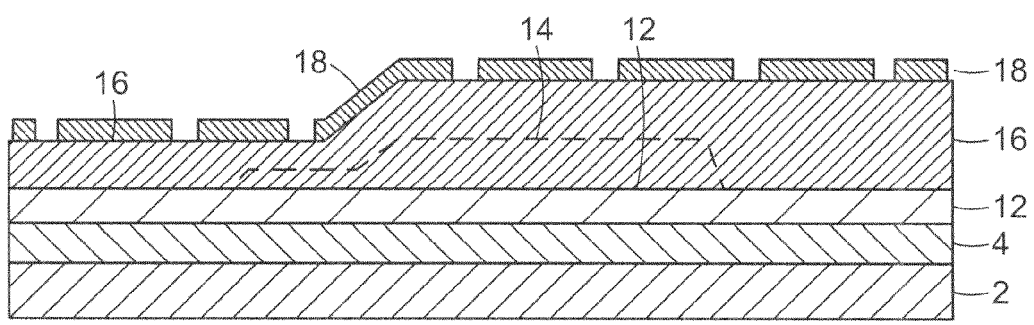
Figure 6A:
FIGS. 6A, 6B and 6C show a top view and a cross-sectional view respectively of the wafer etchant access holes in the inner cap layer.
Figure 6B:
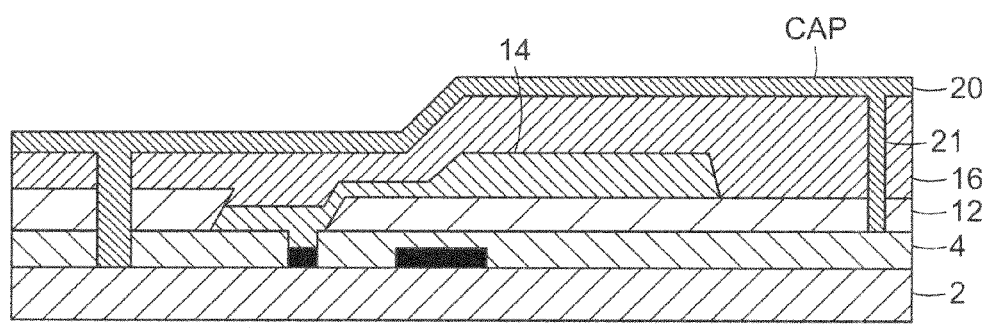
Figure 6C:
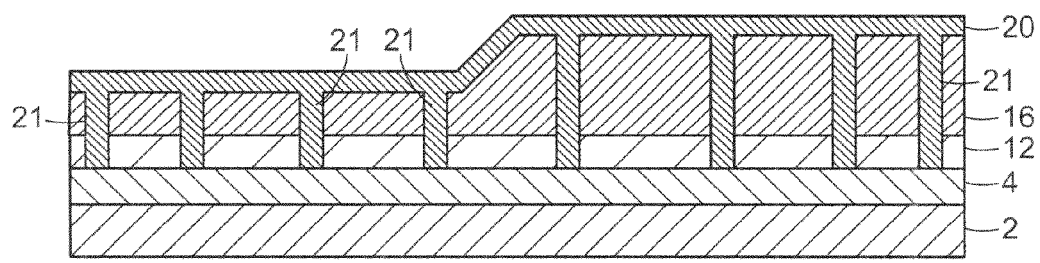
Figure 7A:
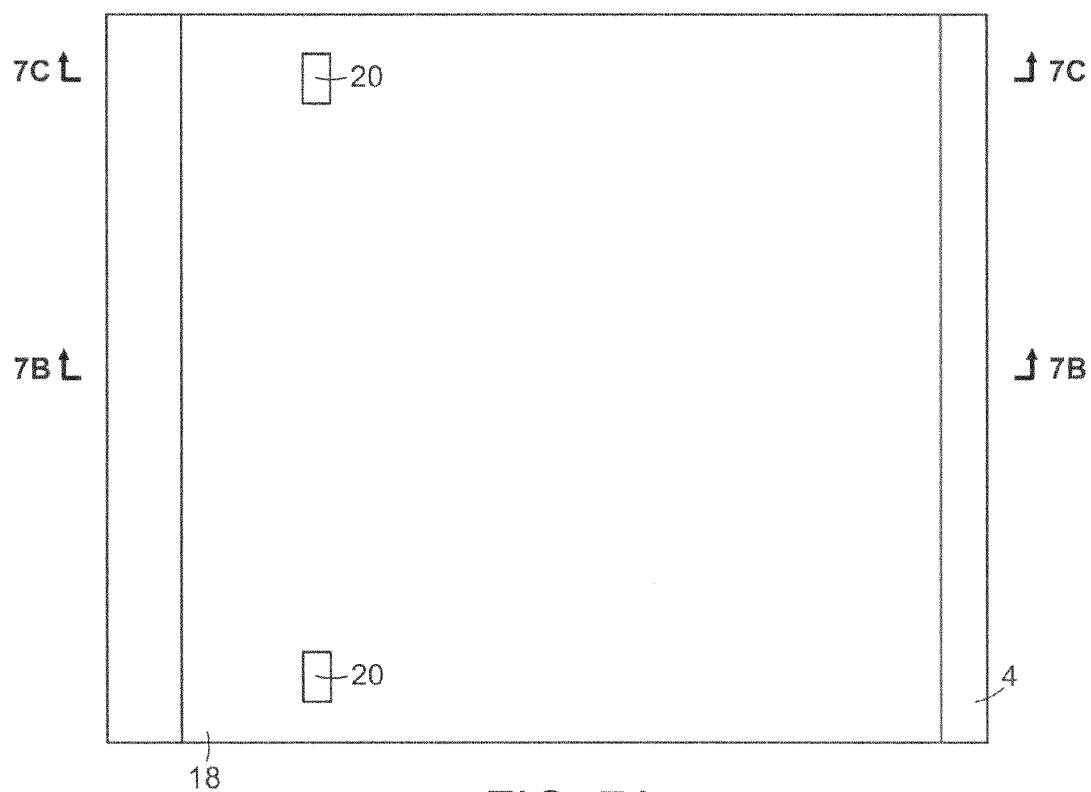
FIGS. 7A, 7B and 7C show a top view and two cross-sectional views respectively of the wafer after the sacrificial layers have been etched away.
Figure 7B:
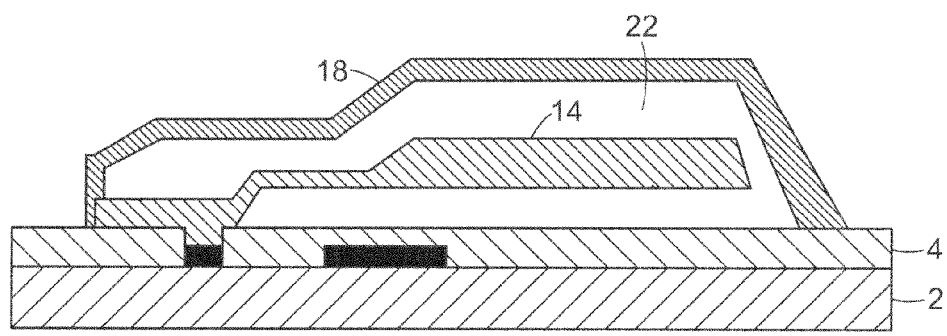
Figure 7C:
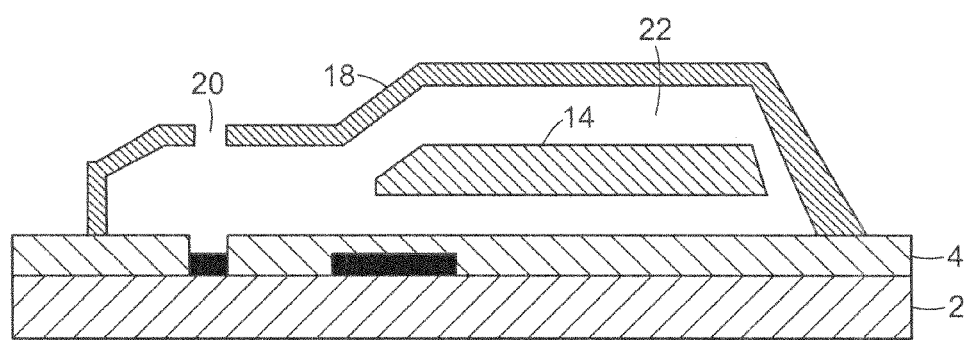
Figure 8A:
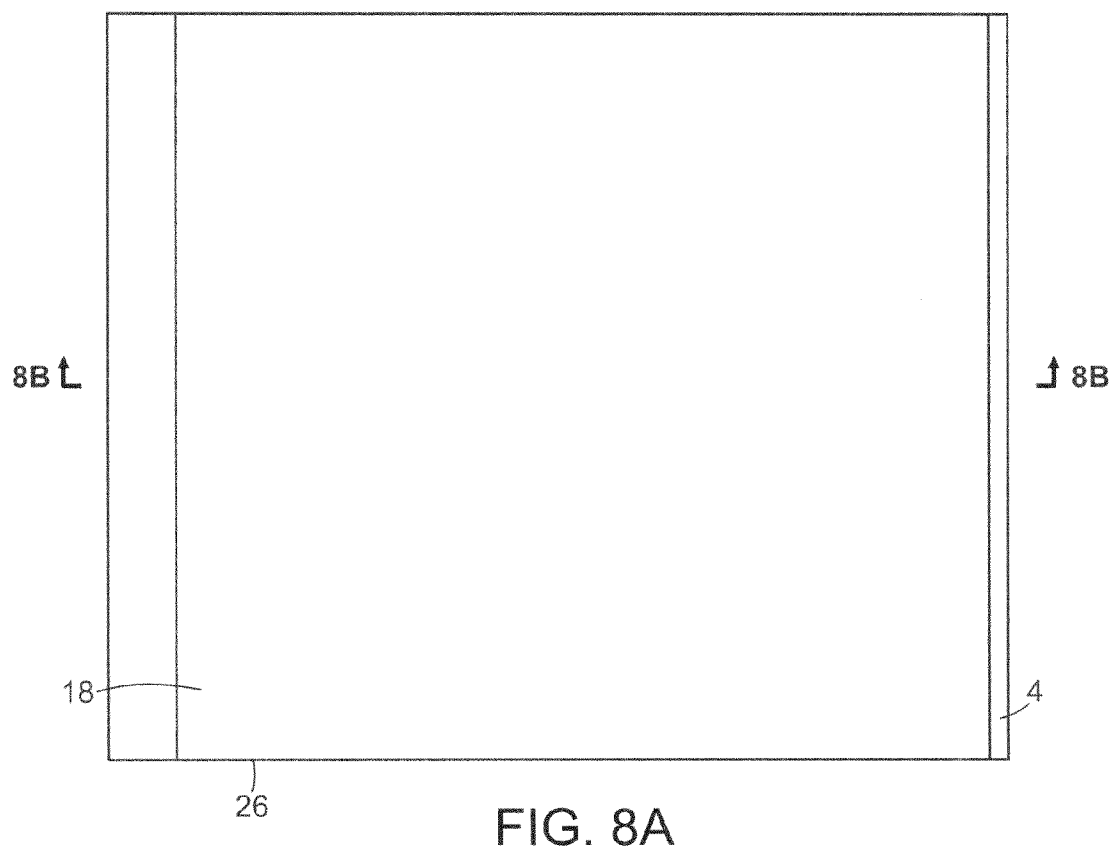
FIGS. 8A, 8B, 8C and 8D show a top view and several cross-sectional views respectively of the wafer having three outer cap layers applied thereon.
Figure 8B:
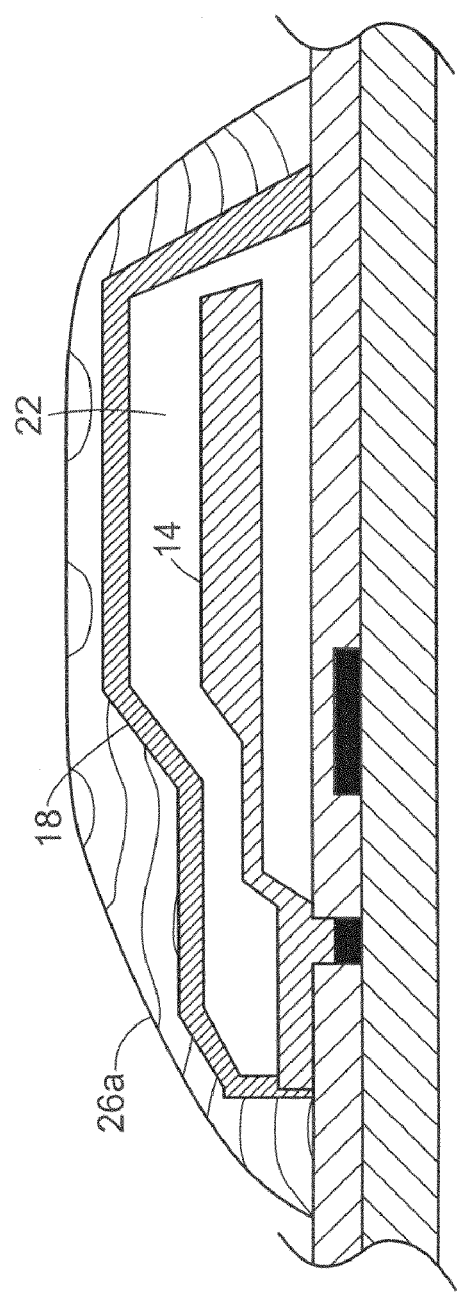
Figure 8C:
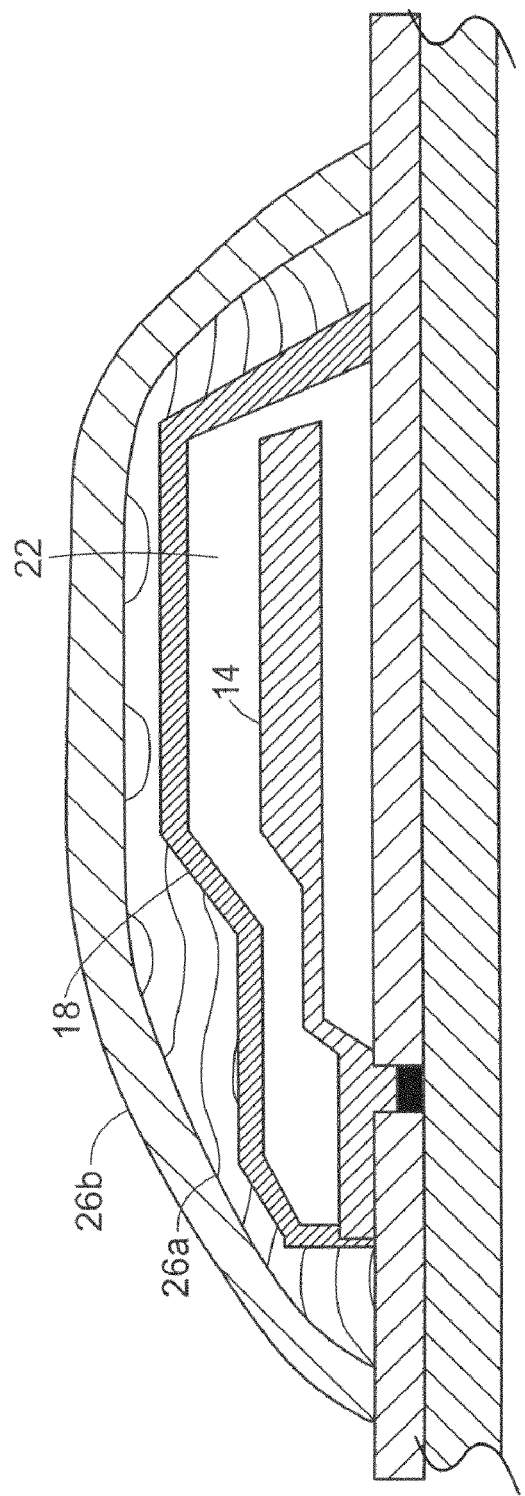
Figure 8D:
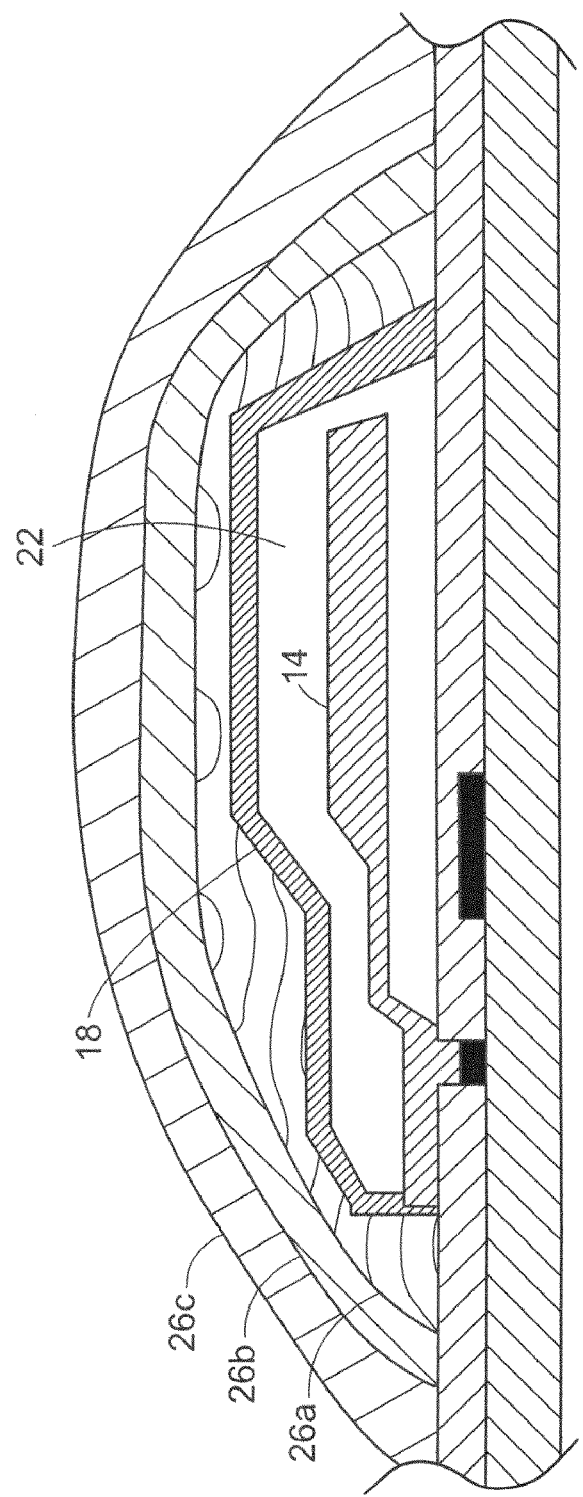

An exemplary deposition process for cap layer 18 is shown in FIGS. 5A and 5B. Cap layer 18 may be composed of an insulator or a conductor, depending on the desired electrical operation of the microstructure. Additionally, cap layer 18 must have a low enough residual stress and must be thick enough that it will not buckle after the sacrificial layers 12 and 16 have been removed. In the preferred embodiment, cap layer 18 is composed of the same metal as was chosen for microstructure 14, but, in alternate embodiments, may be composed of any material resistant to the etchant chosen, such as silicon nitride. Cap layer 18 may also be composed of a the same high stiffness material user for the layers comprising the cap overlayer. Cap layer 18 may be patterned and removed to give access to the non-MEMS parts of the integrated circuit. Additionally, etchant access holes or ports 20 may be etched in cap layer 18 to provide access for the introduction of etchant to remove sacrificial layers 12 and 16.

In one embodiment, the cap layer 18 may include a top portion distalmost from the support surface, the top portion extending in a direction substantially parallel to the support surface and a lateral portion extending between the top portion and the support surface. In this embodiment, the etchant access ports 20 may be disposed in the lateral portion of the cap layer 18. Alternatively, the ports may be disposed in the top portion of the cap layer 18, or the substrate may include one or more etchant access ports 20 extending therethrough in a direction substantially transverse to a normal to the support surface of the substrate.

Alternatively, and according to this invention, cap layer 18 may be made from the same high stiffness material that was selected for a high-stiffness cap overlayer which would be deposited directly on sacrificial layer 16 prior to its removal. In this case cap layer 18 may be composed of a high-stiffness material selected to provide increased mechanical strength, including increased fracture resistance, hardness, and strain resistance, while concomitantly providing a good seal to the underlying encapsulated microstructure.

Suitable high stiffness materials can include, for example, alumina, silicon carbide, zirconium oxide or any ionic bonded, covalently bonded, or mixed ionic and covalently bonded materials. Suitable high stiffness materials for the cap overlayer 26 may include, but are not limited to, alumina, titanium oxide, indium tin oxide, zirconium oxide, yttrium stabilized zirconium oxide, titanium nitride, zirconium nitride, cubic boron nitride, aluminum nitride, titanium boride, zirconium boride, titanium carbide, tungsten carbide, vanadium carbide, boron carbide, zirconium carbide, niobium boride, carbide, silicon carbide, strontium titanate, tantalum carbide, cerium oxide, chromium boride, chromium oxide, beryllium oxide, scandium oxide, tungsten and tungsten alloys, magnesium oxide, mullite, diamond, cordierite, ferrite and garnet.

Figure 9B:
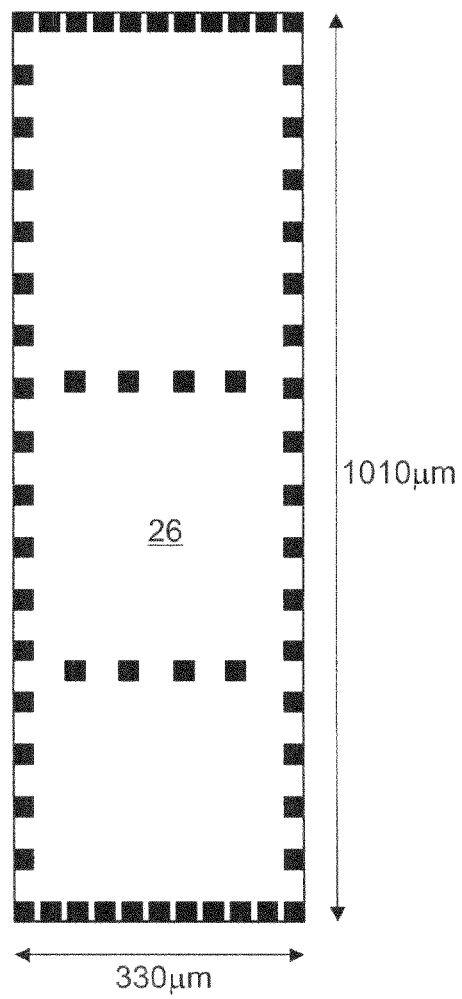
FIGS. 9A and 9B show side and top views respectively of an embodiment of the invention using pillars to create lateral etchant access holes.
Figure 9A:
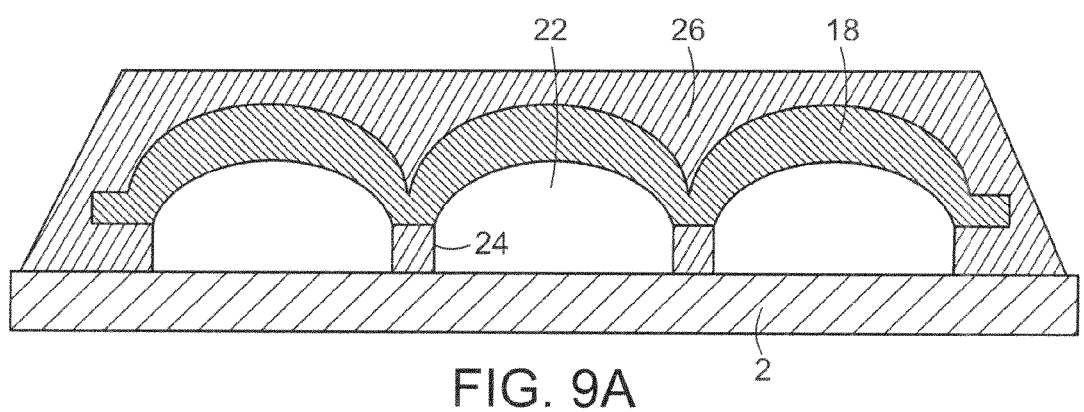

Alternatively, the device may be set up such that no etching of etchant access holes is necessary. Instead, cap layer 18 may be supported by pillars, and the etchant access can be achieved through the etching away of sacrificial material between the pillars, as shown in FIGS. 9A and 9B.

Once all of the sacrificial material has been etched away from under cap layer 18, whether it be silicon nitride, alumina, or a high-stiffness material, microstructure 14 is able to move within cavity 22 previously occupied by sacrificial layers 12 and 16, with beam 15 acting as a spring and contact pad 8 acting as an anchor point.

As shown in FIGS. 8A-8D, cap overlayer 26 may be applied in multiple layers under varying conditions to improve the characteristics of the deposition. In other words, in a preferred embodiment cap overlayer 26 is a multilayer structure having an innermost layer contiguous with cap layer 18. In the example herein, three layers, 26a-26c are shown. Each of the multiple layers forming cap overlayer 26 may be applied by a traditional sputtering process, or by other known deposition processes. In certain exemplary embodiments, one or more of the multiple layers forming cap overlayer 26 may be deposited under varying deposition conditions. For example, for the first layer 26a, shown in FIG. 8B, the pressure may be in the range of 2-100 mT, with 30 mT being an optimal value.

In one embodiment, the cap overlayer 26 may be a graded density structure, having a relatively high density region contiguous with the cap layer. It has been found that the application of a bias voltage during the deposition process tends to smooth the surface of the layer being applied. Therefore, it is desirable that the first cap layer be applied using a bias voltage to avoid the formation of voids where cap layer 26a overlays any sharp corners in the underlying structure. The exact bias voltage applied will vary, depending upon the sputtering machine being used for the deposition. For example, it has been found that, when using a model 620B machine manufactured by Comptech, a bias voltage of about 180v at a pressure of about 30 mTorr produces the desired characteristics. Therefore, with this particular machine, the power may be approximately 0.5-10 watts/cm2, and the bias voltage may be about 90-200v.

Preferably, the sputtering deposition apparatus uses an RF generated plasma (preferably derived from an inert gas such as argon) between a first electrically conductive plate (supporting a material-to-be-deposited, such as aluminum oxide) and a second electrically conductive plate (supporting a substrate upon which the material-to-be-deposited is deposited). A bias voltage, preferably a relatively high bias voltage compared to bias voltages used in prior art sputtering deposition systems, is established between the first and second plates to preferentially accelerate ions in the plasma toward the second plate, with the result that relatively low energy ion bombardment at the material-to-be-deposited effects a relatively low rate sputtering of the material which is deposited on the substrate, and relatively high energy ion bombardment at the substrate knocks off loosely bound deposited material therefrom. As a consequence, a relatively dense, stable deposited layer is formed on the substrate.

It has been found that the use of the relatively high bias voltage tends to reduce the "shadowing" effect caused by sharp corners on cap layer 18 or on the uppermost layer of sacrificial material 16, depending upon which layer the innermost cap overlayer 26a is applied. In the application of the second high—stiffness layer 26b, shown in FIG. 8C, the bias voltage may be eliminated. This tends to even out the thickness of the layer. The third layer 26c may then be applied, again using a 90v-200v bias. The combination of the pressure and the varying bias voltages as each layer is applied tends to make the overall cap more conformal and helps to eliminate intrinsic stress in the high stiffness material, which, if great enough, could cause the cap structure to pull away from the base of the wafer. Preferably, the intrinsic stress gradient of the multi-layer cap structure is at or near zero around the perimeter of the cap, where the cap structure meets the substrate layer 2.

In the event that the first high-stiffness layer has been deposited directly over a sacrificial layer, the second layer of high-stiffness material will also serve to seal any etchant access holes, regardless of whether the holes were etched into the first layer of high-stiffness material, or were formed naturally between pillars supporting the first cap layer.

One skilled in the art will appreciate that, although the exemplary embodiment described above includes a three layer cap structure, either the cap layer 18, or the cap overlayer 26, or both, may comprise one or more layers.

In certain exemplary embodiments, the one or more layers of the cap overlayer 26 or the cap layer 18, may be deposited at a temperature selected to minimize thermal damage to the underlying microstructure. For example, a layer of the cap overlayer 26 or the inner cap layer 18 may be deposited at a temperature less than 125° C., or, in some embodiments, less than 100° C.

The one or more layers of the cap overlayer 26, or the inner cap layer 18, may also be deposited at a low pressure in the presence of an inert gas, such as argon or other noble gases, for the purpose of sealing the gas inside of the cavity with the microstructure. For example, cap overlayer 26 may be deposited in a vacuum chamber at a low pressure of less than 10 mT, sufficient to facilitate deposition, in an argon environment. As a result, the cavity formed by the cap structure can be sealed to create a low pressure, inert environment about the microstructure. Additional layers, including all subsequent layers of cap overlayer 26, may be deposited at higher pressures in the presence of alternative gases.

It may or may not, dependent upon the topology of the wafer and the microstructure, be possible to obtain a sufficiently good seal around the inner chamber with the multiple layers of alumina or other high—stiffness material comprising layers 26a, 26b and 26c. Therefore, in an additional embodiment of the invention, an additional layer of thin material that acts as a good barrier, preferably silicon nitride, may be deposited over the outermost layer of cap overlayer 26, thereby providing an improved seal to the chamber containing the microstructure.

The multi-layer approach has the advantage of being able to build up a relatively thick layer of material that is extremely strong and resistant to damage from environmental forces. Ideally, the cumulative layers of the high—stiffness cap overlayer may be between 5 and 50 microns in thickness, depending upon the area of the wafer which is being encapsulated. The process disclosed herein should produce a cap structure which is able to withstand a pressure in the range of 600-3000 psi at temperatures of up to 300 degrees C., as would typically be encountered during the plastic injection molding process. Additionally, the cap structure produced by this process should be rigid enough and should have adhesion with the wafer sufficient to withstand a uniform pressure equivalent to 60 atmospheres without any portion of the cap structure being deflected by more than one micron from its original position.

A simple microstructure that could be utilized as a Z-axis accelerometer has been described to show the general process of creating a microstructure in a sealed cavity having a high-stiffness, rigid cap structure. However, as will be realized by one of ordinary skill in the art, and as contemplated by the inventors, the process may be used to build microstructures of more complexity, involving many combinations of sacrificial and structural layers. It is also contemplated that movable structures consisting of many layers of stacked sacrificial and structural materials are within the scope of this invention.

Lastly, the figures showing the process are not to scale and should not be construed as limitations on the process in this respect. Note that the term "sealed cavity" as used herein is meant to denote a cavity which has no openings, but which is not necessarily hermetically sealed.

We claim:

1. A MEM device comprising:
    a substrate;
    a microstructure formed on said substrate; and
    a high-stiffness thin-film cap structure forming at least one wall of a sealed cavity encapsulating said microstructure, having a thickness between about 5 and 50 µm, and a Young's modulus of at least about 80 GPa.

2. The MEMS device of claim 1, wherein the thin-film cap structure comprises a cap layer and a cap over-layer including one or more additional layers of high-stiffness material.

3. The MEMS device of claim 2, wherein the cap layer comprises a high-stiffness material deposited in the presence of a first bias voltage.

4. The MEMS device of claim 2, wherein a first layer of the one or more additional layers of the cap over-layer comprises a high-stiffness material deposited in the absence of a bias voltage.

5. The MEMS device of claim 2, wherein a second layer of the one or more additional layer of the cap over-layer comprises a high-stiffness material deposited in the presence of a second bias voltage, the thin-film cap structure constructed using thin-film deposition technologies.

6. The MEMS device of claim 1 further comprising an outer seal layer, said outer seal layer covering the outermost layer of high-stiffness cap structure.

7. The MEMS device of claim 1 wherein said high-stiffness material is selected from a group consisting of ionic bonded materials, covalently bonded material and or mixed ionic and covalently bonded materials.

8. The MEMS device of claim 1 wherein said one or more layers of high-stiffness material can withstand pressures above 600 psi and temperatures up to 300degrees C. when the total thickness of all deposited layers is less than approximately 50 microns.

9. The MEMS device of claim 1 wherein said one or more layers of high-stiffness material can withstand a uniform pressure of unto 60 atmospheres without deflecting more than one micron from its original position.

* * * * *

UNITED STATES PATENT AND TRADEMARK OFFICE
CERTIFICATE OF CORRECTION

| | | |
|---|---|---|
| PATENT NO. | : 7,492,019 B2 | Page 1 of 1 |
| APPLICATION NO. | : 10/383814 | |
| DATED | : February 17, 2009 | |
| INVENTOR(S) | : L. Richard Carley | |

It is certified that error appears in the above-identified patent and that said Letters Patent is hereby corrected as shown below:

Claim 1, column 10, line 23 currently reads as follows:

"1. A MEM device comprising:"

Please correct Claim 1, column 10, line 23 to read as follows:

-- 1. A MEMS device comprising: --

Signed and Sealed this

Twenty-sixth Day of May, 2009

JOHN DOLL
*Acting Director of the United States Patent and Trademark Office*